United States Patent

Park

[11] Patent Number: 5,774,327
[45] Date of Patent: Jun. 30, 1998

[54] HIGH DIELECTRIC CAPACITORS

[75] Inventor: Soon-oh Park, Kyungki-do, Rep. of Korea

[73] Assignee: Samsung Electronics Co., Ltd., Kyungki-do, Rep. of Korea

[21] Appl. No.: 757,502

[22] Filed: Nov. 27, 1996

[30] Foreign Application Priority Data

Nov. 29, 1995 [KR] Rep. of Korea .................. 95-44902

[51] Int. Cl.[6] ................................................ H01G 4/06
[52] U.S. Cl. .................. 361/321.5; 361/313; 361/321.1; 361/321.4; 257/306; 257/310; 257/296; 257/300; 257/295
[58] Field of Search ........................... 361/311–313, 320, 361/321.1–321.5; 257/295, 296, 300, 306–311; 29/25.42; 438/381, 396–399

[56] References Cited

U.S. PATENT DOCUMENTS 5,382,817  1/1995  Kashihara et al. .................. 257/295
5,559,733  9/1996  McMillan et al. .................. 365/145

*Primary Examiner*—Bot L. Ledynh
*Attorney, Agent, or Firm*—Myers Bigel Sibley & Sajovec

[57] ABSTRACT

Capacitors and methods of fabricating high dielectric capacitors which do not create a step difference where the high dielectric material is formed are provided. These methods include forming a first electrode layer on an integrated circuit device substrate and a layer of high dielectric material on the first electrode layer opposite the integrated circuit device substrate. A second electrode layer is formed on the layer of high dielectric material opposite the first electrode layer. The first electrode layer, the high dielectric layer and the second electrode layer are patterned to form a capacitor cell unit having a sidewall which extends from the first electrode beyond the layer of high dielectric material and to the second electrode layer. An insulating spacer is formed on the sidewall of the capacitor cell unit extending from the first electrode layer to the second electrode layer.

6 Claims, 4 Drawing Sheets

HIGH DIELECTRIC CAPACITORS

FIELD OF THE INVENTION

The present invention relates to very large scale integrated (VLSI) semiconductor devices and methods of fabricating such devices. More particularly, the present invention relates to capacitors and methods of fabricating capacitors for VLSI devices.

BACKGROUND OF THE INVENTION

As integrated circuit devices, such a dynamic random access memory (DRAM), become more highly integrated the size of particular devices such as transistors and capacitors generally has to become smaller to achieve an increase in the degree of integration. Thus, as devices have become more integrated, typically, the effective area of capacitors has become smaller. With reduced area available for forming a capacitor it may become more difficult to achieve a desired capacitance using conventional dielectric films such as a nitride/oxide (NO) film or $Ta_2O_5$ film.

In an effort to increase the effective area of a capacitor, three-dimensional storage electrodes such as cylindrical or fin type storage electrodes have been fabricated. However, the cylindrical or fin type capacitor typically has a complicated structure which is produced by a complicated and difficult fabrication process. As a result of the complicated fabrication process, the cylindrical or fin type storage electrodes may be uneconomical to produce. Furthermore, the difficulty in the fabrication process may result in degraded reliability of the cylindrical or fin type storage electrode capacitors over more conventional capacitors.

To solve the problems caused by reduced capacitor area, research was begun into high dielectric films. This research included materials having a perovskite structure, e.g., $BaTiO_3$, $PbTiO_3$, $SrTiO_3$ (STO), $Pb(Zr, Ti)O_3$ (PZT), and $(Ba, Sr)TiO_3$ (BST). The dielectric constant of these high dielectric materials are 100 times higher than that of a NO film. Therefore, it is possible to achieve a desired capacitance with less area and without the need for a complicated cylindrical or fin-type electrode.

A conventional method of fabricating a capacitor utilizing these high dielectric materials is illustrated in FIGS. 1 to 5. FIG. 1 illustrates a polysilicon plug 12 formed on a semiconductor substrate 10 on which transistors are formed. As seen in FIG. 2 a diffusion barrier film 13 is formed to cover the polysilicon plug 12 and a lower electrode 14 is formed on the diffusion barrier film 13. As shown in FIG. 3, after forming the lower electrode 14 an insulating film 16 is deposited to cover the lower electrode 14 and the diffusion barrier film 13. An insulating film spacer 16a is then formed by etching back the insulating film 16 by performing an anisotropic dry etching process of the insulating film 16 as is shown in FIG. 4.

As seen in FIGS. 3 and 4, the insulating film spacer 16a is formed on both sides of the storage electrode 14 by coating an insulating film between and on the storage electrodes and performing an etchback process. However, to provide a good surface for forming a dielectric film on electrode 14 an overetch should be performed on the insulating film 16. The overetch of the insulating film 16 removes all the residual materials of the insulating film 16 on the lower electrode 14 and forms the insulating film spacer 16a. However, because the insulating layer 16 is overetched, a step difference A is produced between the lower electrode 14 and the spacer 16a. After formation of the insulating space 16a, a high dielectric film 18 and an upper electrode 19 are deposited on the lower electrode 14, as shown in FIG. 5.

An insulating film spacer 16a is formed because, generally, the high dielectric film 18 is deposited by sputtering. Deposition of the high dielectric film 18 may be easily performed by sputtering and reproducibility of the film is excellent. However, one disadvantage of depositing the high dielectric film by a sputtering method is that such a deposition typically provides poor step coverage of the high dielectric film. As a result it may be difficult to deposit the high dielectric film 18 on the side of storage electrode 14. The insulating spacer 16a is formed to fill in the area surrounding the electrode 14 in an effort to compensate for the poor step coverage of the high dielectric film. However, because of the etchback process the step A still exists between the insulating spacer 16a and the electrode 14. Since the step coverage of the high dielectric film 18 is low, the high dielectric film 18 is formed with weak coverage in the portion of the step A at the edge of the lower electrode 14. This weak coverage area may increase leakage currents at the edge of the electrode 14. Thus, the capacitor formed by the conventional methods may not achieve as high a capacitance value as would be possible if these leakage currents could be prevented.

In view of the above discussion, the need exists for additional improvements in high dielectric capacitors and the methods for fabricating high dielectric capacitors.

SUMMARY OF THE INVENTION

In view of the above discussion, it is an object of the present invention to provide high dielectric capacitors with reduced leakage currents.

Another object of the present invention is to provide high dielectric capacitors with increased capacitance per unit area over conventional high dielectric capacitors.

Still another object of the present invention is to provide such high dielectric capacitors without requiring a complicated and difficult fabrication process.

These and other objects of the present invention are provided by methods of fabricating a high dielectric capacitor which do not create a step difference where the high dielectric material is formed. These methods include forming a first electrode layer on an integrated circuit device substrate and a layer of high dielectric material on the first electrode layer opposite the integrated circuit device substrate. A second electrode layer is formed on the layer of high dielectric material opposite the first electrode layer. The first electrode layer, the high dielectric layer and the second electrode layer are patterned to form a capacitor cell unit having a sidewall which extends from the first electrode past the layer of high dielectric material and to the second electrode layer. An insulating spacer is formed on the sidewall of the capacitor cell unit so that the insulating spacer extends from the first electrode layer to the second electrode layer. Thus, the capacitor is formed without having to form the high dielectric layer on a step.

By avoiding creation of a step difference when the high dielectric material is formed the weak deposition areas of conventional high dielectric capacitors may be avoided. Thus, a more uniform high dielectric layer may be provided in capacitors fabricated according to the present invention. This more uniform high dielectric layer may reduce the likelihood of leakage currents at the edges of the electrodes caused by weak deposition of the high dielectric material. Thus, high dielectric capacitors fabricated according to the methods of the present invention may have reduced leakage currents over conventionally fabricated high dielectric capacitors and increased capacitance per unit area as a result.

In a further embodiment of the present invention the step of forming the first electrode layer is preceded by the step of forming a diffusion barrier layer on the integrated circuit substrate. The first electrode layer is then formed on the diffusion barrier layer opposite the integrated circuit substrate and the diffusion barrier layer, the first electrode layer, the high dielectric layer and the second electrode layer are patterned. Furthermore, an electrode may be formed on the second electrode layer of the unit cell opposite the layer of high dielectric material.

In particular embodiments of the present invention the insulating spacer is formed by forming a layer of insulating material on a first surface of the second electrode layer opposite the layer of high dielectric material and on the sidewall of the capacitor cell unit. This insulating layer is then removed to a depth below the first surface of the second electrode layer so as to provide the insulating spacer. The layer of insulating material may be removed by etching the layer of insulating material.

In further embodiments of the present invention the first electrode is formed of an oxidation-resistant material. In particular embodiments, the oxidization-resistant material may be Pt, Ru, Ir or Pd. Similarly, the layer of high dielectric material may be $BaTiO_3$, $PbTiO_3$, $SrTiO_3$, $Pb(Zr, Ti)O_3$ or $(Ba, Sr)TiO_3$. The diffusion barrier layer may be formed of TiN or $RnO_2$.

The capacitor cell unit may also be heat treated so as to stabilize an interface between the first electrode layer and the layer of high dielectric material and an interface between the second electrode layer and the layer of high dielectric material. This heat treatment may be carried out at a temperature of from about 600° to about 800° C.

A further embodiment of the present invention provides methods for fabricating a high dielectric capacitor which include forming a first conductive layer on an integrated circuit substrate and forming a high dielectric layer on the first conductive layer opposite the integrated circuit substrate. A second conductive layer is formed on the high dielectric layer opposite the first conductive layer. A capacitor electrode pattern is then formed by etching the first conductive layer, the high dielectric layer and the second conductive layer to define a sidewall of the capacitor electrode pattern which extends from the first conductive layer past the high dielectric layer to the second conductive layer. An insulating layer is then formed on exposed surfaces of the patterned first conductive layer, the high dielectric layer and the second conductive layer. An insulating layer spacer is formed on the sidewall of the capacitor electrode pattern by etching the insulating layer. The surface of the high dielectric layer adjacent the second conductive layer may define the end point of the etching process. Additionally a third conductive layer may be formed on the insulating layer spacer and the second conductive layer of the capacitor electrode pattern and patterned to provide an electrode which extends onto the sidewall of the second conductive layer.

In additional embodiments, the present invention includes forming a diffusion barrier layer on the integrated circuit substrate. In such an embodiment, the first conductive layer is formed on the diffusion barrier layer opposite the integrated circuit substrate. The first conductive layer, the high dielectric layer and the second conductive layer of the capacitor electrode pattern may also be heat treated to stabilize interfaces between the first conductive layer, the high dielectric layer and the second conductive layer. This heat treatment may be carried out at a temperature of from about 600° to about 800° C. The heat treatment may also be carried out in a non-oxidizing atmosphere.

The present invention also provides high dielectric capacitors which include an integrated circuit substrate with a first electrode layer on the integrated circuit substrate. The capacitor also includes a layer of high dielectric material on the first electrode layer opposite the integrated circuit substrate and a second electrode layer on the layer of high dielectric material opposite the first electrode layer. The first electrode layer, the high dielectric layer and the second electrode layer form a capacitor cell unit having a sidewall which extends from the first electrode layer past the layer of high dielectric material and to the second electrode layer. The capacitor includes an insulating spacer on the sidewall and extends at least from the first electrode layer to the second electrode layer.

In additional embodiments, the capacitor includes a diffusion barrier layer formed between the integrated circuit substrate and the first electrode layer. In such an embodiment, the sidewalls of the capacitor cell unit extend to the diffusion barrier layer. A third electrode may also be included in the capacitor. This third electrode may be formed on the second electrode layer of the unit cell and extend onto the sidewall of the second electrode layer.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE PREFERRED EMBODIMENTS

Figure 1:
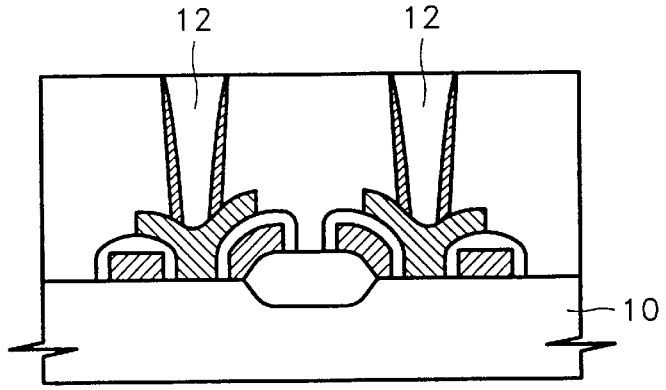
FIGS. 1 through 5 are cross-sectional views illustrating the fabrication steps of a high dielectric capacitor according to conventional fabrication process.
Figure 2:
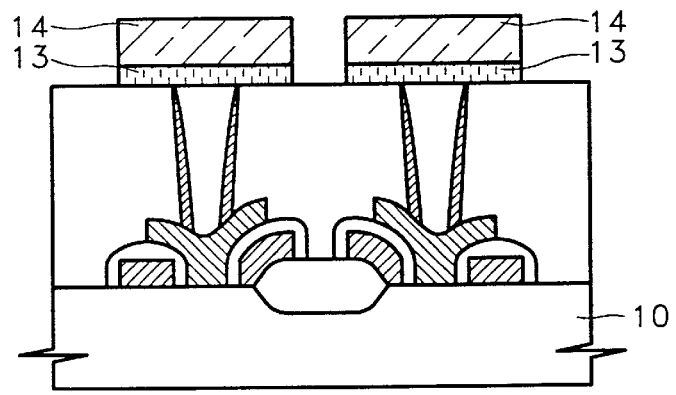
Figure 3:
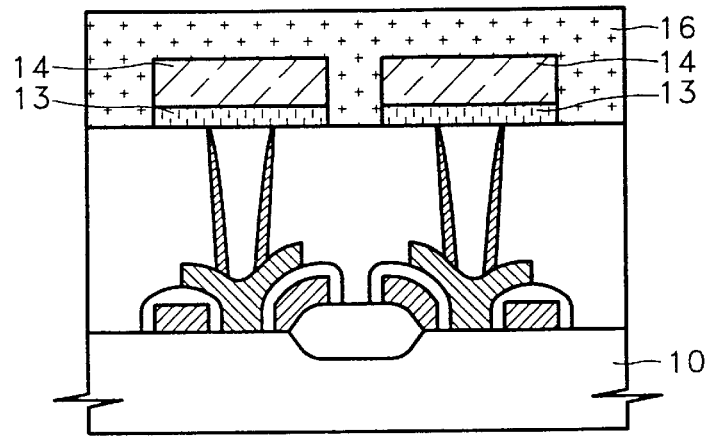
Figure 4:
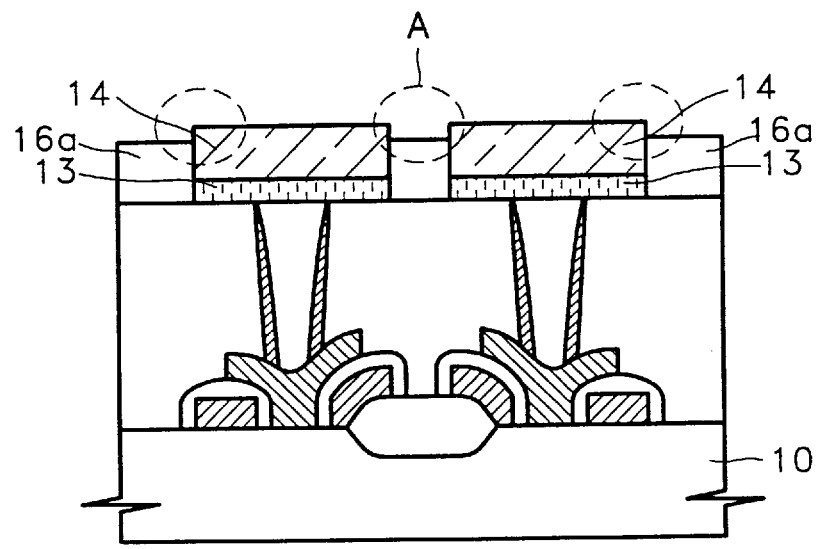
Figure 5:
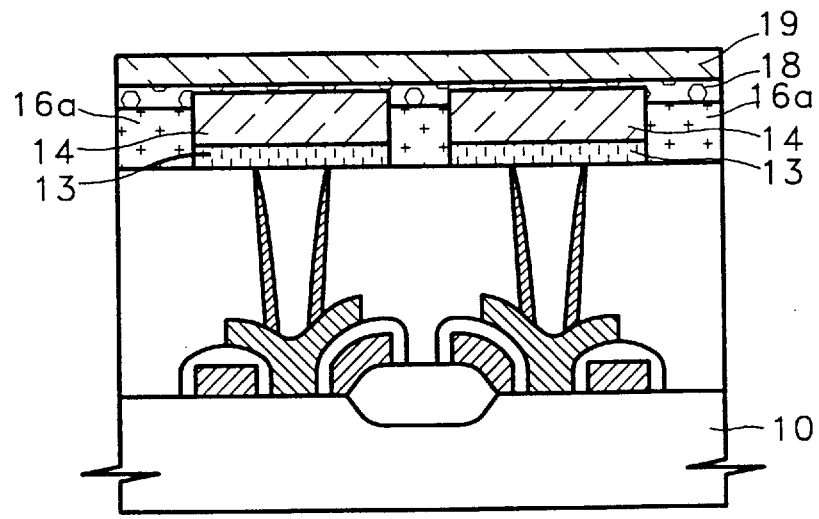

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Methods for fabricating high dielectric capacitors according to the present invention will be described with reference to FIGS. 6 through 10.

Figure 6:
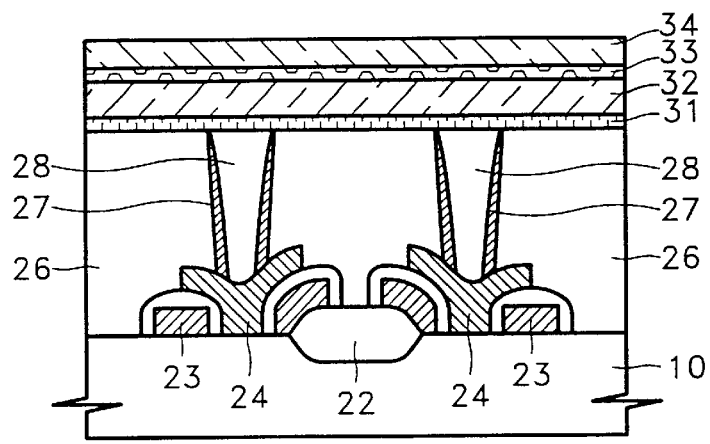
FIGS. 6 through 10 are cross-sectional views illustrating the steps for fabricating a high dielectric capacitor according to the present invention.

Referring to FIG. 6, a device isolation region 22 is formed on a semiconductor substrate 10 by a Local Oxidation of Silicon (LOCOS) method. A transistor is created by forming a gate electrode 23 and forming source and drain regions by ion-implementing impurities. Then, after forming a pad electrode 24 between the gate electrodes 23, an insulating layer 26 is formed for device insulation and planarization. The insulating layer 26 may be formed using a silicon oxide layer or a borophosphosilicate glass (BPSG) by chemical vapor deposition (CVD). After forming a contact hole which exposes the pad electrode 24 by etching the insulating layer 26, the contact hole is filled with polysilicon, thereby forming a plug 28. A spacer 27 may also be formed using a nitride layer or other suitable material for protecting the side wall of the contact hole prior to filling the contact hole with polysilicon.

Thus, an integrated circuit substrate may be provided on which a capacitor according to the present invention may be formed. As used herein the term integrated circuit substrate refers to a semiconductor substrate, a semiconductor substrate having integrated circuits formed on the semiconductor substrate or other types of substrates having integrated circuits formed on the substrate. As will be appreciated by those of skill in the art, references to a layer formed "on" a substrate or other layer may refer to the layer formed directly on the substrate or other layer or on an intervening layer or layers formed on the substrate or other layer.

As is seen in FIG. 6, a diffusion barrier layer 31 is formed on the integrated circuit substrate. A first electrode layer 32 is formed on the diffusion barrier layer 31 opposite the integrated circuit substrate. A dielectric layer 33 is formed on the first electrode layer 32 opposite the diffusion barrier layer 31. Finally, second electrode layer 34 is formed on the dielectric layer 33 opposite the first electrode layer 32.

The layers, 31, 32, 33 and 34 may be sequentially formed by sputtering or other methods known to those of skill in the art. The diffusion barrier layer 31 is formed to prevent the impurities doped on a conductive material such as the semiconductor substrate 10 and the polysilicon plug 28 or the silicon from diffusing into the first electrode layer 32. Suitable materials for forming the diffusion barrier layer 31 include a titanium nitride layer (TiN) and ruthenium oxide ($RuO_2$). Suitable materials for forming the first electrode layer 32 include oxidation-resistant materials such as Pt, Ru, Ir, or Pd. Suitable materials for forming the dielectric layer 33 include $BaTiO_3$, $PbTiO_3$, STO, PZT, and BST. The second electrode layer 34 may also be made of Pt, Ru, Ir, or Pd or other suitable materials known to those of skill in the art.

Figure 7:
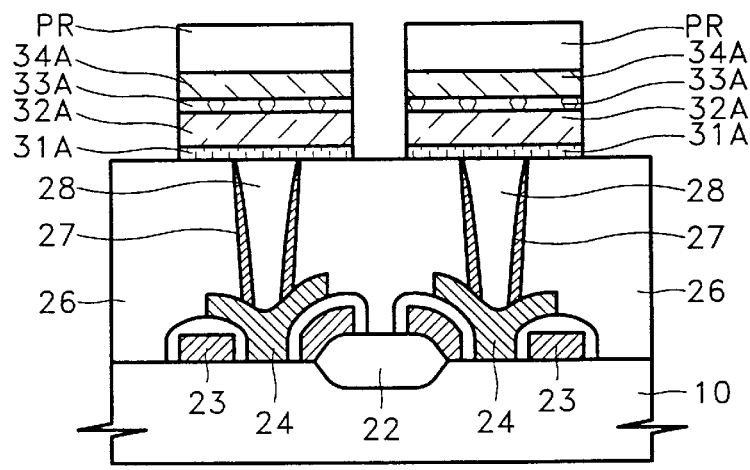

Referring to FIG. 7, electrode patterns 31A, 32A, 33A and 34A of the capacitor are formed to create capacitor cell units. As seen in FIG. 7, the capacitor cell units are formed to define a sidewall of the capacitor cell unit which extends from the first electrode layer 32A past the dielectric layer 33A and to the second electrode layer 34A. The sidewall of the capacitor cell unit may extend to the integrated circuit substrate as is illustrated in FIG. 7. The capacitor cell unit may be defined by a photoresist mask pattern PR. This mask pattern may be used in an etching process to create the capacitor cell unit. For example, the capacitor cell unit may be formed by etching the second electrode layer 34, high dielectric layer 33, first electrode layer 32, and the diffusion barrier layer 31 by an anisotropic dry etching method using the predetermined mask pattern PR.

After removing the mask pattern PR, a heat treatment can be performed under a non-oxidizing atmosphere, for example, a $N_2$ atmosphere, at a temperature of from about 600° to about 800° C., preferably of about 750° C. The heat treatment may be performed to remove etching damage of the high dielectric layer 33A, which may be caused by the anisotropic dry etching method. Furthermore, the heat treatment may stabilize the interface between the high dielectric layer 33A and the second electrode layer 34A and the interface between the high dielectric layer 33A and the first electrode layer 32A. The heat treatment may also enhance the dielectric constant of the high dielectric layer 33A.

Figure 8:
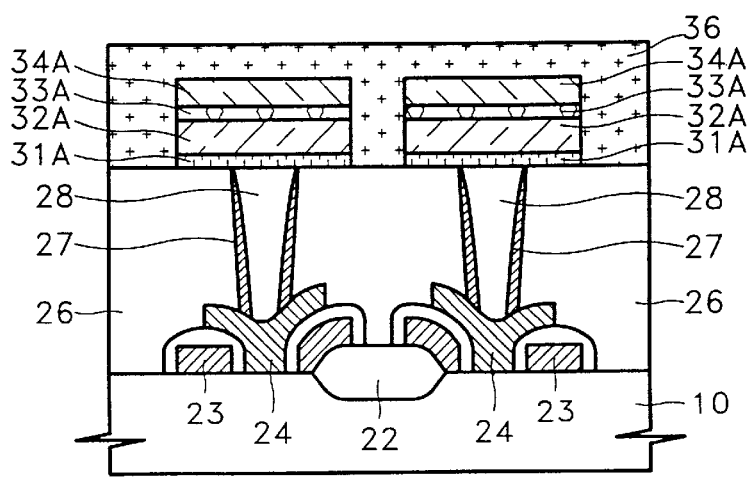

As shown in FIG. 8, after forming the capacitor cell unit an insulating layer 36 is deposited to a thickness sufficient to coat the exposed surfaces of the capacitor cell unit layers 31A, 32A, 33A, and 34A. Suitable materials for the insulating layer 36 include silicon oxide, a spin-on-glass (SOG) or a silicon nitride.

Figure 9:
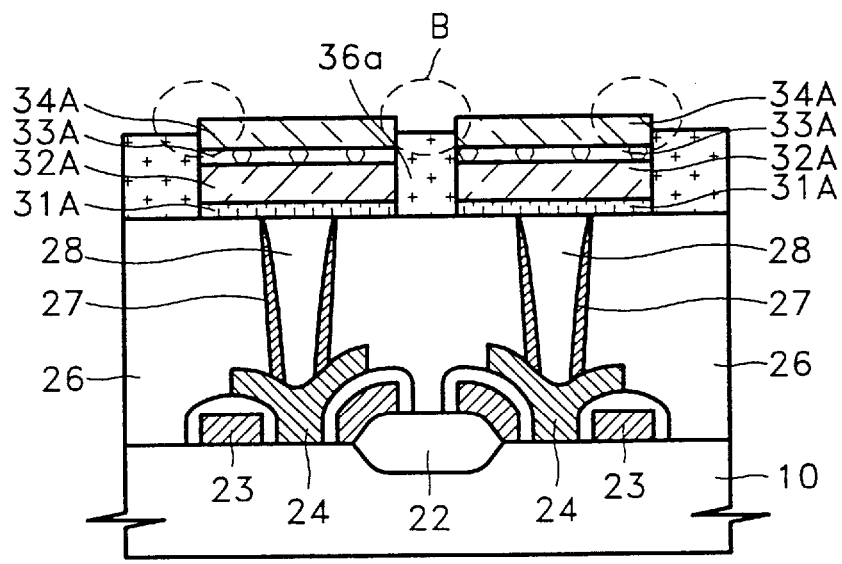

After forming the insulating layer 36, an insulating layer spacer 36a is formed as shown in FIG. 9. The insulating layer spacer 36a may be formed by performing an etching process so that the insulating layer 36 formed on the surface of the second electrode layer 34A opposite the high dielectric layer 33A is removed. The surface of the high dielectric layer 33A opposite the first electrode layer 32A may be used as an ending point of the etching process. Thus, as is seen in FIG. 9, even if a step difference B is generated at the edge of the second electrode layer 34A because of an overetch of the insulating layer to assure that all material is removed from the surface of the second electrode layer 34A, such a step difference B should not affect the electrical characteristics of the device.

Figure 10:
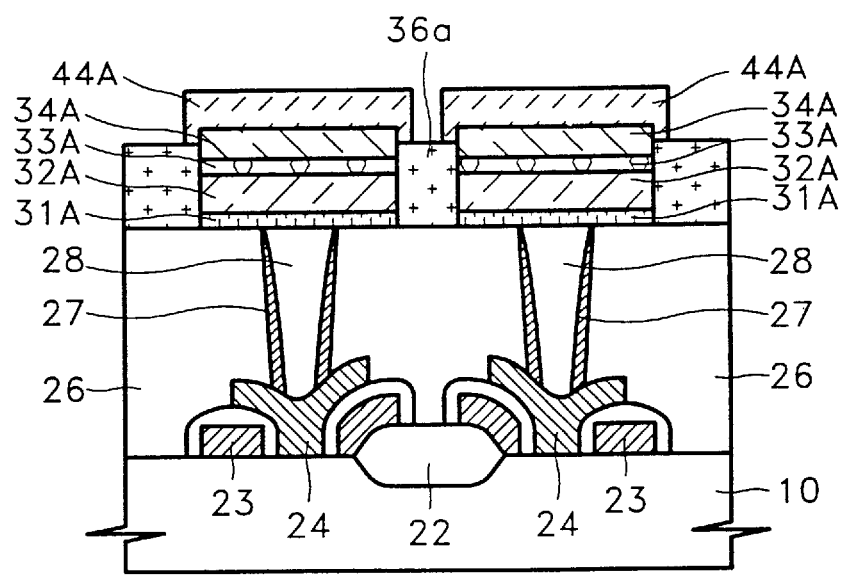

As seen in FIG. 10, the high dielectric capacitor is completed by depositing an electrode material 44 on the entire surface of the capacitor cell unit and the insulating space 36a and then patterning the electrode material 44 to form a third electrode layer 44A. This third electrode layer may extend onto a sidewall of the second electrode layer 34A.

As is illustrated in FIGS. 6 through 10, the methods for manufacturing high dielectric capacitors of the present invention having an insulating spacer 36a create the spacer after formation of the electrodes and dielectric layer. Therefore, the dielectric layer may be formed on a surface topography which allows for a uniform deposition of the high dielectric material and without having to deposit material on a step. Accordingly, leakage currents may be reduced because of the uniform nature of the dielectric material formed between the electrodes.

In the drawings and specification, there have been disclosed typical preferred embodiments of the invention and, although specific terms are employed, these terms are used in a generic and descriptive sense only and not for purposes of limitation, the scope of the invention being set forth in the following claims.

That which is claimed is:

1. A high dielectric capacitor comprising:
   an integrated circuit substrate;
   a first electrode layer on the integrated circuit substrate;
   a layer of high dielectric material on the first electrode layer opposite the integrated circuit substrate;
   a second electrode layer on the layer of high dielectric material opposite the first electrode layer;
   wherein said first electrode layer, said high dielectric layer and said second electrode layer define a capacitor cell unit having a continuous sidewall which extends from the first electrode layer beyond the layer of high dielectric material and to the second electrode layer; and
   an insulating spacer on said sidewall and extending at least from the first electrode layer to the second electrode layer and ending before a surface of the second electrode layer opposite the layer of high dielectric material.

2. A high dielectric capacitor according to claim 1, further comprising:
   a diffusion barrier layer formed between said integrated circuit substrate and said first electrode layer; and wherein said sidewalls of said capacitor cell unit extend to said diffusion barrier layer.

3. A high dielectric capacitor according to claim 2, wherein said diffusion barrier layer is formed of a material selected from the group consisting of TiN and $RnO_2$.

4. A high dielectric capacitor according to claim 1, further comprising a third electrode formed on said second electrode layer of said unit cell and extending onto the sidewall of said second electrode layer.

5. A high dielectric capacitor according to claim 1, wherein said first electrode layer is formed of an oxidation-resistant material.

6. A high dielectric capacitor according to claim 1, wherein said layer of high dielectric material is formed of a material selected from the group consisting of $BaTiO_3$, $PbTiO_3$, $SrTiO_3$, $Pb(Zr, Ti)O_3$ and $(Ba, Sr)TiO_3$.

* * * * *